United States Patent [19]

Ohtsuka et al.

[11] 4,006,022
[45] Feb. 1, 1977

[54] RECORDING PROCESS UTILIZING SUPERCOOLED ORGANIC COMPOUNDS

[75] Inventors: Shuichi Ohtsuka; Seiichi Taguchi; Satoru Honjo, all of Asaka, Japan

[73] Assignee: Fuji Photo Film Co., Ltd., Minami-ashigara, Japan

[22] Filed: Nov. 19, 1973

[21] Appl. No.: 417,323

[30] Foreign Application Priority Data

Nov. 18, 1972 Japan .................. 47-115843

[52] U.S. Cl. .................. 96/48 R; 96/88
[51] Int. Cl.$^2$ .................. G03C 5/24
[58] Field of Search .................. 96/48, 88

[56] References Cited

UNITED STATES PATENTS

| | | | |
|---|---|---|---|
| 3,654,864 | 4/1972 | Oushinsky | 96/88 |
| 3,678,852 | 7/1972 | Feinleib et al. | 96/88 |
| 3,723,119 | 3/1973 | Yoshida et al. | 96/33 |
| 3,784,375 | 1/1974 | Gilman et al. | 96/1.5 |
| 3,813,242 | 5/1974 | Ikeda et al. | 96/1.5 |

FOREIGN PATENTS OR APPLICATIONS 1,128,822 10/1968 United Kingdom

OTHER PUBLICATIONS

"New Thermal Reproducing Process, Using the Nature of Supercooling," T. Kishida, Chem. Abstr., vol. 65, 1966 p. 4905c.

*Primary Examiner*—David Klein
*Assistant Examiner*—Judson R. Hightower
*Attorney, Agent, or Firm*—Sughrue, Rothwell, Mion, Zinn & Macpeak

[57] ABSTRACT

A recording process using at least one organic compound capable of exhibiting two or more different physical forms at the same temperature which may be converted to one another, and irradiating the organic compound with electromagnetic waves, and thereafter, converting in either the irradiated portion of the organic compound or the non-irradiated portion thereof, the physical form in existence before the irradiation with the electromagnetic waves to another physical form.

15 Claims, 1 Drawing Figure

RECORDING PROCESS UTILIZING SUPERCOOLED ORGANIC COMPOUNDS

BACKGROUND OF THE INVENTION

1. Field of the Invention

The present invention relates to a recording process, and more precisely, to a recording process using at least one organic compound which is capable of exhibiting two or more different physical forms at the same temperature.

2. Description of the Prior Art

Various processes for recording information have heretofore been known, including a photographic process using silver salts such as silver halides, a diazotype photographic process using diazo compounds, an electrophotographic process using photo-conductive insulators, a process using photochromic compounds, a photo-polymerization process using photo-polymerizable substances, and so on. The present inventors have conducted various studies on a new recording process where compounds which are quite different from the substances used in the above described conventional recording processes and which have a plurality of stable (including semi-stable) physical forms (such as liquid crystals, crystals, etc.) at normal temperatures or in the vicinity thereof, are used; and at last have achieved the present invention.

SUMMARY OF THE INVENTION

The present invention provides a new recording process comprising irradiating a recording material comprising at least one organic compound, which is capable of having two or more different physical forms and which can be converted from one physical form to another at the same temperature, with electromagnetic waves thereby converting, in either the irradiated part of the recording material or the non-irradiated part thereof, the physical form of the organic compound before the irradiation to another physical form.

BRIEF DESCRIPTION OF THE ACCOMPANYING DRAWING

The FIGURE shows an explanatory drawing of one embodiment of the recording process of the present invention.

DETAILED DESCRIPTION OF THE INVENTION

Figure 1:
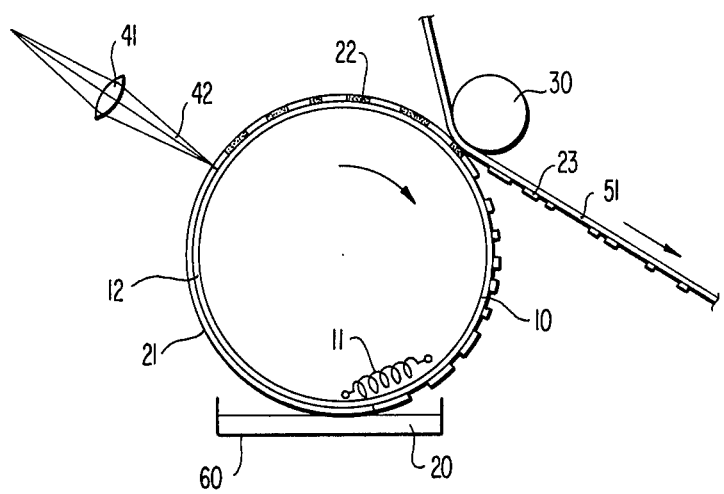

In the present invention, a most characteristic element is the use of organic compound which can have two or more stable and semi-stable physical forms at the same temperature with the conversion from one stable form to another stable form exhibited by the compounds being accelerated or inhibited by the action or stimulation of electromagnetic waves.

Examples of these organic compounds are compounds which have melting points of 0° to 200° C, preferably 40° to 100° C, and which can be in a sufficient supercooled state. Such organic compounds in the supercooled state are suitably present in the range of 2 to 50%, preferably 10 to 25%, with the degree of the supercooled state as defined below.

$$\text{Degree of Supercooled State (\%)} = \frac{(\text{Melting Point (° K)}) - (\text{Crystallization Initiating Temperature (° K)})}{(\text{Melting Point (° K)})} \times 100$$

Representative examples of these organic compounds are, for example, benzotriazole, benzil, benzoin, vanillin, tribenzylamine, N-vinylcarbazole, benzophenone, diphenylamine, diaminodiphenylmethane, triphenylamine, benzoic anhydride, itaconic acid, diacetoneacrylamide, acrylamide, azoxybenzene, azobenzene, trans-stilbene, triphenylmethane, dihydroanthracene, benzamide, alpha-naphthol, o-phthalaldehyde, etc.

The melting point (°C) and degree of supercooled state (%) of each of these organic compounds are shown in the following Table 1:

Table 1

| Compound | Melting Point (°C) | Degree of Supercooled State (%) | Compound | Melting Point (°C) | Degree of Supercooled State (%) |
|---|---|---|---|---|---|
| Benzotriazole | 99 | 10 | Diacetoneacrylamide | 60 | 10 |
| Benzil | 95 | 20 | Acrylamide | 85 | 10 |
| Benzoin | 134 | 10 | Azoxybenzene | 35 | 3 |
| Vanillin | 83 | 20 | trans-Stilbene | 123 | 8 |
| Tribenzylamine | 92 | 15 | Triphenylmethane | 94 | 10 |
| N-Vinylcarbazole | 67 | 15 | Dihydroanthracene | 109 | 8 |
| Benzophenone | 49 | 10 | Benzamide | 125 | 7 |
| Diphenylamine | 54 | 10 | alpha-Naphthol | 96 | 10 |
| Itaconic Acid | 162 | 10 | o-Phthalaldehyde | 50 | 6 |
| Benzoic Anhydride | 41 | 5 | Azobenzene | 68 | 11 |

Now, one embodiment for image formation according to the recording process of the present invention where an organic compound showing a supercooled state is used, will be explained hereinafter. Initially, the organic compound is applied on an appropriate support, such as those generally used in the photographic industrial fields, for example, a glass plate, a metal plate such as an aluminum plate, a plastic film such as a film of cellulose triacetate, cellulose diacetate, polyethyleneterephthalate, polyethylene, polypropylene, polystyrene or the like, a synthetic paper, a baryta paper, or a paper or a synthetic paper laminated with a resin such as polyethylene, etc., and then the coated material is heated to the melting point or above of the organic compound used, preferably to a temperature of 5° to 10° C higher than the melting point, and thereafter the material is gradually cooled to form the supercooled state. Then, the thus supercooled organic compound is irradiated with electromagnetic waves. The portions irradiated with electromagnetic waves immediately crystallize due to the stimulation of the electromagnetic waves, while the other non-irradiated portions still remain unaffected or in a highly viscous liquid state. The material is further cooled quietly, whereby the non-irradiated liquid portions solidify as such in a glassy form to consequently form glassy portions having a higher transparency as compared with the crystallized part resulting from the irradiation with the electromagnetic waves. Thus, an image like-pattern is formed, and this can be preserved as a stable image for a long time providing that the material is not extraordinarily heated.

On the other hand, when the supercooled state of the organic compound is produced according to the above procedure, the material irradiated with electromagnetic waves and then the irradiated substance is gradually cooled, the organic compound in the non-irradiated portions crystallizes, while the irradiated portions remains non-crystalline or even if it crystallizes, the crystals of the latter crystallized part of the irradiated portions is different from that of the former crystallized part of the non irradiated portions, and thus an image can also be obtained.

The electromagnetic waves which can be employed in the present invention are those, etc., light, electron beams, $\alpha, \beta$, and $\gamma$-rays, etc., having a wavelength falling within the range of 250 to 800 nm, preferably in the visible region of about to 350 to 700 nm and of course laser rays whose wavelength is in this range are included.

The above described organic compounds which can have a supercooled form can be applied on the support in the form of a dispersion in an aqueous solution of a hydrophilic high molecular weight compound. Examples of suitable hydrophilic high molecular weight substances are, for example, gelatin, gelatin derivatives such as phthalic gelatin, graft gelatin, etc., polyvinyl alcohol, polyvinyl pyrrolidone, polyethylene-vinyl acetate hydrolysis product, hydroxyalkyl celluloses and mixtures of these etc. These can be employed alone or as mixtures of two or more of them. The amount of the high molecular weight material binder used is in the range of 0.02 to 10, preferably 0.2 to 2, (weight ratio) on the basis of the amount of the organic compound used.

The application of the organic compound having a supercooled state to a support can be performed according to conventional methods, and for example, when only the organic compound is applied to the support, the compound is heated and melted and is coated on the support using dip-coating, bar-coating, hopper-coating, roller-coating or a like method. On the other hand, when a binder is used together with the organic compound, the organic compound is dispersed in an aqueous solution of the binder, and the resulting dispersion is applied on the support using a conventional method, for example, dip-coating, bar-coating, hopper-coating, air-knife-coating or a like method.

The thickness of the coating generally is in the range of 0.2 to 200 $\mu$, preferably 5 to 20 $\mu$. It is possible to increase the sensitivity of the recording process of the present invention to a great extent by using the above described organic compound exhibiting a supercooled state, in combination with a substance which sensitizes the response occurring due to the irradiation of electromagnetic waves in the recording process of the present invention (hereafter referred to as a sensitizer). Such a sensitizer either accelerates or additionally inhibits the conversion of the organic compound from one state of aggregation to another. Such a substance is a compound that responds to electromagnetic waves and serves to accelerate the formation of different physical forms of the above described organic compounds exhibiting a supercooled state, this difference occurring in accordance with the electromagnetic waves.

Representative examples of these sensitizers are, for example, halogenated hydrocarbons such as carbon tetrabromide, metal carboxylate compounds such as lead acetate, zinc acetate or silver behenate, metal halides such as silver chloride, silver bromide, silver iodide, lead bromide, lead iodide, copper iodide, copper bromide, potassium iodide, potassium bromide, potassium chloride or sodium iodide, silver nitrate, silver phosphate iodide ($Ag_7I_4PO_4$), silver phosphate and dyes having absorption maxima at 250 to 800 m$\mu$ such as azo dyes, e.g., Acid Red 176 (C.I. 16575), Basic Orange 2 (C.I. 11,270 ), Direct Violet 1 (C.I. 22,570) etc.; diphenylmethane dyes, e.g., Basic Yellow 2 (C.I. 41,000) etc.; triphenylmethane dyes, e.g., Tetrabromophenol Blue, Bromophenol Red etc.; xanthene dyes e.g., Rhodamine B Acid Red 45 (C.I. 45,386), Acid Red 51 (C.I. 45,430) etc.; quinoline dyes, e.g., Acid Yellow 3 (C.I. 47,005) etc.; anthraquinone dyes, e.g., Acid Blue 27 (C.I. 61,530), Acid Blue 54 etc.; methine dyes, e.g., Basic Yellow 33, Basic Red 35 etc.; of these dyes, the xanthene dyes, quinoline dyes and triphenylmethane dyes are the most preferred. These sensitizers can be used alone or as a mixture of two or more of them. The sensitizers can be mixed with the organic compound exhibiting a supercooled state, or the sensitizer and the organic compound can be applied separately on a support as two layers adjacent to each other with one layer containing the sensitizer and the other layer the organic compound, respectively. The amount of the sensitizer added is in the range of 1 to 1/10000, preferably 1.3 to 1/100, (weight ratio) on the basis of the weight of the organic compound with which the sensitizer is used.

The images obtained according to the recording process of the present invention can be transferred to an appropriate transfer material. A method for continuously obtaining images by utilizing the process of this invention will be explained in greater detail by reference to the FIGURE attached hereto. 10 is a rotatable cylinder, and the surface thereof is coated with a sensitizer 12. This coating layer 12 is dipped in a coating solution 20 in a container 60, the solution 20 comprising a molten organic compound which exhibits a supercooled state. Then, a layer 21 comprising the organic compound is formed on the layer 12. This coating layer 21 is, after application, cooled to a desired temperature, and then a desired signal 42 of electromagnetic waves passed through a lens 41 impinges on the layer 21. In layer 21, the portion on which the signal 42 has impinged crystallizes to form a crystalline portion 22, while the part on which the signal 42 has not impinged remains as such in a non-crystalline viscous state, and the non-crystalline viscous portions are then transferred to a material 51 which is pressed against the layer 21 using a press-roller 30 whereby a recording pattern 23 is formed. On the other hand, the non-transferred portions 22 are again melted using a heater 11 and returned to the coating solution 20. According to such a series of steps, continuous recording of information is practical.

On the other hand, it also is possible in the recording process of the present invention to color the non-crystalline part of the organic compound which can be supercooled, by irradiating the organic compound with electromagnetic waves and, after cooling the same, if necessary, feeding a colorant (dye) to the resulting image. In this case, the portion to be colored must be viscous when the dye is fed thereto. The dye used for coloration is not specifically limited, and various kinds of dyes can be used therefor.

In the recording process of the present invention, images can be formed according to the so-called dry-treatment, and further the present process is economical since the recording materials used can be repeatedly reused. In addition, the present process has various advantages such that erasing and image recording are possible.

Now, the present invention will be explained in greater detail by reference to the following Examples which are not intended to limit the scope of the present invention. Unless otherwise, indicated all parts and percents are by weight.

EXAMPLE 1

Benzil and silver iodide were admixed together in a ratio of 5:1 (by weight), and then were pulverized in a mortar to form fine powders having diameters of 0.05 mm or less. The resulting powders were separated to two samples of several milligrams, and each of the samples was put on a washed glass plate, and heated to a temperature of 102° C and then cooled to 89° C. One of the samples was exposed to light while the other of the samples was not. A super-pressure mercury vapor lamp was used as the light source, and a heat-absorbing filter was used together. The illuminance on the exposed surface was 8500 luxes and the exposure time was 80 seconds. As a result, all of the samples included in the group which had been exposed to light were crystallized, while the non-exposed samples remained as such or in the original liquid state. This condition was not apparently changed at least up to 70° C. When cooled further from the 70° C temperature to room temperature, the non-exposed parts were also crystallized. However, the last crystallized parts were different from the first crystallized parts with respect to the light scattering efficiency therebetween, and thus the difference between the exposed part and the non-exposed part was clearly distinguished from each other even after a long period of time.

EXAMPLE 2

Mixed crystals of lead iodide and silver iodide (pulverized particles of lead iodide and silver iodide in a molar ratio of 7:3 were heat-treated at 300° C) were used instead of the silver iodide in Example 1, and others were the same as in Example 1. In this case, the difference in crystallization between irradiation with light and the absence thereof could clearly be distinguished even when the time of the exposure to light was reduced to 40 seconds.

EXAMPLE 3

Fine powders of a mixture of benzophenone and silver phosphate iodide in a weight ratio of 4:1 were separated into samples of several milligrams each and put on a washed glass, and then, after heating to 54° C, were cooled to 44° C. Thereafter, one group of these samples was exposed to light and the other was not. A super-pressure mercury vapor lamp was used as the light source, and a heat-absorbing filter was used. The illuminance on the exposed surface was 8500 luxes and the exposure was carried out for 110 seconds. As a result, the exposed portion crystallized and turned white, and the non-exposed portion began to crystallize after cooling to 24° C. The same samples were again heated up to 54° C, and then supercooled in a manner similar to the above described first procedure, and thereafter were exposed to light to crystallize then. At 40° C, methylene-blue dye powders at about 40° C were uniformly scattered on both the portion crystallized after exposure with light and the non-crystallized portion, and after 30 seconds, the thus treated substances were inverted together with the glass plate to remove the dye adhered to the surface thereof (this coloring operation is hereunder referred to as "visibility imparting treatment"). In the liquid portion which had not been exposed to light the dye powders diffused into the interior thereof, and the visual transmission density thereof was confirmed to be 2 or more after a comparison of the density with a standard density plate. On the other hand, in the portion crystallized due to the exposure to light, almost all of the dye powder was removed and only a trace of the dye powders remained on this portion. The visual density of the slightly dyed portion was 0.1 or less, and thus it can be seen that a positive image-like record having a contrast of 1.9 or more was formed. While the temperature of the samples was later lowered to room temperature (about 20° to 30° C), the non-exposed part began to crystallize also, but the difference in the transmission density with the dye remained as such.

EXAMPLE 4

Silver nitrate was used in place of the silver phosphate iodide in Example 3, and the other materials were same as those of Example 3. The exposure was carried out for 75 seconds at 8500 luxes and at a temperature of 44° C. As a result, the portion exposed to light crystallized and turned white, and the non-exposed portion began to crystallize after cooling to 36° C. Accordingly, in this Example, it was noted that, although the sensitivity to light was higher than that in Example 3, the suitable temperature range for the visibility imparting treatment is relatively narrow, that is, from 44° C to 37° C.

EXAMPLE 5

Fine powders of a 5:1 mixture of benzil and mixed crystals of lead iodide and silver iodide as used in Example 2 were dispersed in a 2% (by weight) gelatin aqueous solution, and then resulting dispersion was applied on a polyethylene-terephthalate film of a thickness of 0.2 mm. The weight of the coated layer was, after being dried, 3.0 mg/cm$^2$, that is, the total amount of the above benzil and mixed crystals of lead iodide and silver iodide was 1.2 mg/cm² and the amount of gelatin was 1.8 mg/cm².

The coated layer, after being dried, was subjected to the same heat-treatment and exposure as in Example 3, whereby a recording pattern was obtained which crystallized in accordance with the pattern of the exposure mask used.

EXAMPLE 6

In the above described Example 5, the benzil and the mixed crystals of lead iodide and silver iodide were separately dispersed in the 2% gelatin aqueous solution to form two gelatin dispersions, respectively. In the first place, the benzil dispersion was applied on the 0.2 mm thick polyethylene-terephthalate film, and then the mixed crystal dispersion was applied thereupon, and thereafter the coated film was dried. This was subjected to the same heat-treatment and exposure as in Example 2, to obtain a recording pattern. However, the sharpness of the obtained pattern was inferior to that of Example 5.

EXAMPLE 7

A sample consisting of a crystallized portion and a non-crystallized liquid portion, which had been obtained in a manner similar to Example 1, was contacted with a baryta paper (weighing 135 g/m²) for several seconds and then separated, whereby almost all of the two portions transferred to the baryta paper while a trace of the liquid portion remained on the glass plate. In this procedure, the sample and the baryta paper were kept warmed at about 65° C.

EXAMPLE 8

In the above described Example 1, the sample cooled to room temperature was again heated to 98° C, whereby both the exposed portion and the non-exposed portion were melted. The thus melted sample was again supercooled and then the same treatment as in Example 2 was repeated, whereupon the same behavior as in Example 1 was exhibited. It was noted from this that erasure and repeated use are possible in the present recording process.

EXAMPLE 9

Powders obtained by mixing acrylamide monomer and carbon tetrabromide in a weight ratio of 2:1 and then pulverizing the mixture were used and the other materials were the same as in Example 1 in this Example. In the present case, however, the heating was up to 89° C, and then, after cooling the sample to 81° C, the sample was exposed to light for 160 seconds. In this stage, no apparent difference between the exposed portion and the non-exposed portion was observed. After being cooled to 42° C, the non-exposed portion part began to crystallize and turned white. The thus treated sample was subjected to the same visibility imparting treatment as in Example 3, whereby only the exposed portion was colored. This is a negative type recording process.

EXAMPLE 10

N-vinylcarbazole monomer and Rhodamine-B were mixed in a weight ratio of 19:1, and then the same procedure as in Example 9 was carried out. In the present case, however, the heating was up to 71° C and the exposure was carried out for 230 seconds at 62° C. At this stage, no apparent difference between the exposed portion and the non-exposed portion was observed. After being cooled to 42° C, the non-exposed portion began to crystallize and turned white. The thus treated sample was subjected to the same visibility imparting treatment as in Example 3, whereby only the exposed portion was colored with the cyan dye. In the resulting image, the background was the magenta color of the Rhodamine-B used. This is also a negative type recording process like Example 9.

EXAMPLE 11

Diamino-diphenyl-methane was used alone, and other materials were same as in Example 1. In this Example, however, the heating was up to 97° C and the exposure for 280 seconds at 87° C. At this stage, the exposed portion was merely colored pale brown and thus no sufficient contrast was as yet obtained. Thereafter when the temperature of the substance was lowered to 54° C, the non-exposed portion began to crystallize and turned white. After the same visibility imparting treatment as in Example 3, only exposed portion was colored.

While the invention has been described in detail and with reference to specific embodiments thereof, it will be apparent to one skilled in the art that various changes and modifications can be made therein without departing from the spirit and scope thereof.

What is claimed is:

1. A recording process comprising heating a recording material comprising a support having thereon a layer of at least one organic compound selected from the group consisting of benzothiazole, benzil, benzoin, vanillin, tribenzylamine, N-vinylcarbazole, benzophenone, diphenylamine, diaminodiphenylmethane, triphenylamine, benzoic anhydride, itaconic acid, diacetoneacrylamide, acrylamide, azoxybenzene, azobenzene, trans-stilbene, triphenylmethane, dihydroanthracene, benzamide, alpha-naphthol and o-phthaledehyde, said organic compound being capable of exhibiting a supercooled state until said organic compound melts; cooling said organic compound to a supercooled condition; and thereafter image wise irradiating said layer of said organic compound with electromagnetic waves such that the irradiated portion of the organic compound crystallizes.

2. The process of claim 1, wherein the recording material is cooled subsequent to irradiation and crystallation to solidify the non-irradiated portion of the organic compound by crystallization, the crystallization of said non-irradiated portion having a different structure than the crystalline structure of the irradiated portion.

3. The recording process as claimed in claim 1, wherein said organic compound has a melting point ranging from 0° to 200° C and a degree of supercooled state in percent as defined by $$\text{Degree of Supercooled State} = 100 \times \frac{\text{Melting Point (° K)} - \text{Crystallization Initiating Temperature (° K)}}{\text{Melting Point (° K)}}$$

in the range of 2 to 50%.

4. The recording process as claimed in claim 1, wherein said organic compound is in combination with a sensitizer.

5. The recording process as claimed in claim 4, wherein said sensitizer is selected from the group consisting of a metal carboxylate, a metal halide, silver nitrate, silver phosphate, silver phosphate iodide, a sensitizing dye and mixtures thereof.

6. The recording process as claimed in claim 5, wherein said metal carboxylate is selected from the group consisting of lead acetate, zinc acetate and silver behenate.

7. The recording process as claimed in claim 5, wherein said metal halide is selected from the group consisting of silver chloride, silver bromide, silver iodide, lead bromide, lead iodide, copper bromide, copper iodide, potassium iodide, potassium bromide, potassium chloride and sodium iodide.

8. The recording process as claimed in claim 5, wherein said sensitizing dye is an azo dye, a diphenylmethane dye, a triphenylmethane dye, a xanthene dye, a quinoline dye, an anthraquinone dye or a methine dye.

9. The recording process as claimed in claim 1 wherein the said recording material contains a sensitizer.

10. The recording process as claimed in claim 9, wherein said layer comprises said organic compound and said sensitizer in admixture.

11. The recording process as claimed in claim 9, wherein said recording material comprises a layer of said sensitizer as an individual layer adjacent said layer of said organic compound.

12. The recording process as claimed in claim 1, wherein said process comprises cooling said recording material after irradiating with said electromagnetic waves.

13. The recording process of claim 1 further comprising transferring under pressure said organic compound in the non-irradiated portion of said layer to a transfer material.

14. The recording process of claim 1 further comprising applying a dye to said layer of said organic compound whereby the non-irradiated portion of said layer of said organic compound is colored.

15. The process of claim 1, wherein said electromagnetic waves have a wavelength falling within the range of 250 to 800 nm.

* * * * *